(12) United States Patent
Lowe, Jr. et al.

(10) Patent No.: US 8,900,919 B2
(45) Date of Patent: Dec. 2, 2014

(54) ROBUST INK FORMULATIONS FOR DURABLE MARKINGS ON MICROELECTRONIC PACKAGES AND ITS EXTENDIBILITY AS A BARRIER MATERIAL FOR THERMAL AND SEALANT MATERIALS

(71) Applicant: Intel Corporation, Santa Clara, CA (US)

(72) Inventors: Randall D. Lowe, Jr., Chandler, AZ (US); Suriyakala Suriya Ramalingam, Chandler, AZ (US); Nisha Ananthakrishnan, Chandler, AZ (US); James C. Matayabas, Jr., Chandler, AZ (US); Arjun Krishnan, Chandler, AZ (US); Hitesh Arora, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/801,059

(22) Filed: Mar. 13, 2013

(65) Prior Publication Data
US 2014/0264957 A1    Sep. 18, 2014

(51) Int. Cl.
*H01L 21/44* (2006.01)
*H01L 23/02* (2006.01)
*H01L 23/28* (2006.01)
*C09D 11/107* (2014.01)

(52) U.S. Cl.
CPC .............. *C09D 11/107* (2013.01); *H01L 23/28* (2013.01)
USPC ............ 438/106; 438/107; 257/678; 257/797

(58) Field of Classification Search
USPC ............................ 438/106, 107; 257/678, 797
See application file for complete search history.

(56) References Cited

U.S. PATENT DOCUMENTS

2013/0243948 A1* 9/2013 Baker et al. .................. 427/162
2014/0163130 A1* 6/2014 Zhang et al. .................. 522/18

* cited by examiner

*Primary Examiner* — Long Pham
(74) *Attorney, Agent, or Firm* — Schwegman Lundberg & Woessner, P.A.

(57) ABSTRACT

Methods for covalently and indelibly anchoring a polyacrylate polymer using a UV-induced polymerization process in the presence of a photoinitiator to an oxide surface are disclosed herein. The methods and compositions prepared by the methods can be used as indelible marking materials for use on microelectronic packages and as solder and sealant barriers to prevent overspreading of liquids on the oxide surfaces of microelectronic packages. The polyacrylate polymers are covalently linked to the oxide surface by use during the printing and UV-curing process of an adhesion promoter having as a first domain an oxide-reactive silyl group, bonded via a linker to an acrylate-reactive group.

19 Claims, 8 Drawing Sheets

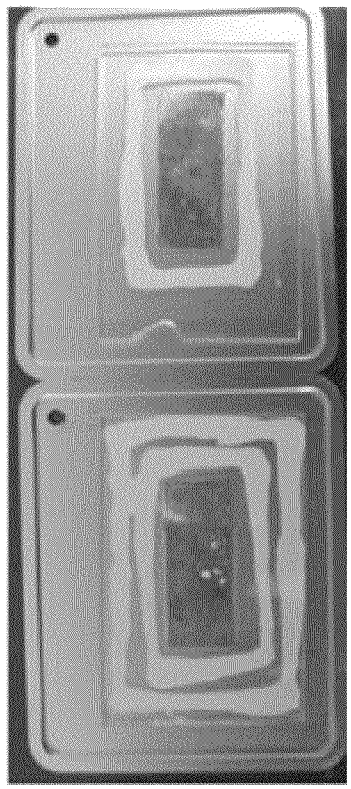
Fig. 4C
Fig. 4B
Fig. 4A
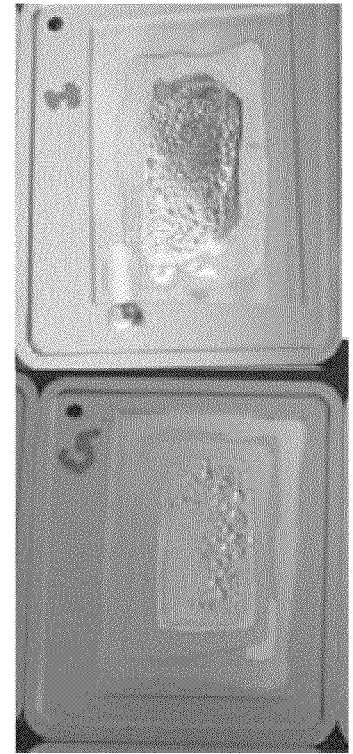
Fig. 4F
Fig. 4E
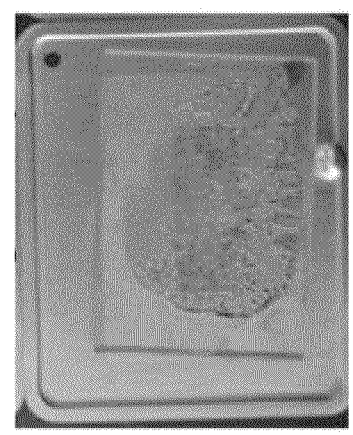
Fig. 4D

US 8,900,919 B2

ROBUST INK FORMULATIONS FOR DURABLE MARKINGS ON MICROELECTRONIC PACKAGES AND ITS EXTENDIBILITY AS A BARRIER MATERIAL FOR THERMAL AND SEALANT MATERIALS

TECHNICAL FIELD

Embodiments pertain to polymeric ink materials for indelible bonding to surfaces of microelectronic packages and its extendibility as a barrier for thermal and sealant type materials bleed out

BACKGROUND

Microelectronic packages are currently labeled using laser markings on a variety of surfaces. Laser markings have the primary disadvantage of destroying a portion of the surfaces being marked. Silicon die and integrated heat spreaders are two surfaces in microelectronic packages that are commonly marked. Laser marking induced damage is particularly troublesome for thin silicon die because it can cause die cracking. Die backside films (DBFs) are currently used to protect silicon die from laser-induced damage during marking. However, using DBFs increases assembly costs through additional materials, tools, and processing processes. Ink markings could replace currently used laser markings, but inks exhibit poor adhesion which prevents their use in marking applications.

BRIEF DESCRIPTION OF THE DRAWINGS

FIGS. 4A-4F shows indium solder-based thermal interface (S-TIM) materials on integrated heat spreaders (IHSs): 4A before and, 4B after reflow without barrier and 4C-4F with barrier as printed by method disclosed herein.

DETAILED DESCRIPTION

The subject matter disclosed herein includes processes for covalently and indelibly anchoring a polyacrylate polymer, using a UV-induced polymerization process in the presence of a photoinitiator, to an oxide surface; to compositions prepared by the processes disclosed and claimed herein; and to microelectronic packages incorporating, e.g., as inks and ink as a barrier for controlling sealant and STIM bleed out, anchored polyacrylate polymers covalently bonded to oxide surfaces.

An "oxide surface" as the term is used herein refers to a solid surface of a material composed of oxides of various chemical elements, wherein a surface of the material includes oxygen atom exposed for reaction. Examples of oxides include silicon oxide, aluminum oxide, titanium oxide, nickel oxide, copper oxide, and other oxides such as are used in microelectronic devices. The oxide surface can be the surface of a microelectronic package which is available for marking with information related to the package, such as a part number, a serial number, or the like. Silicon die and integrated heat spreaders are two surfaces in microelectronic packages that are commonly marked.

Figure 1:
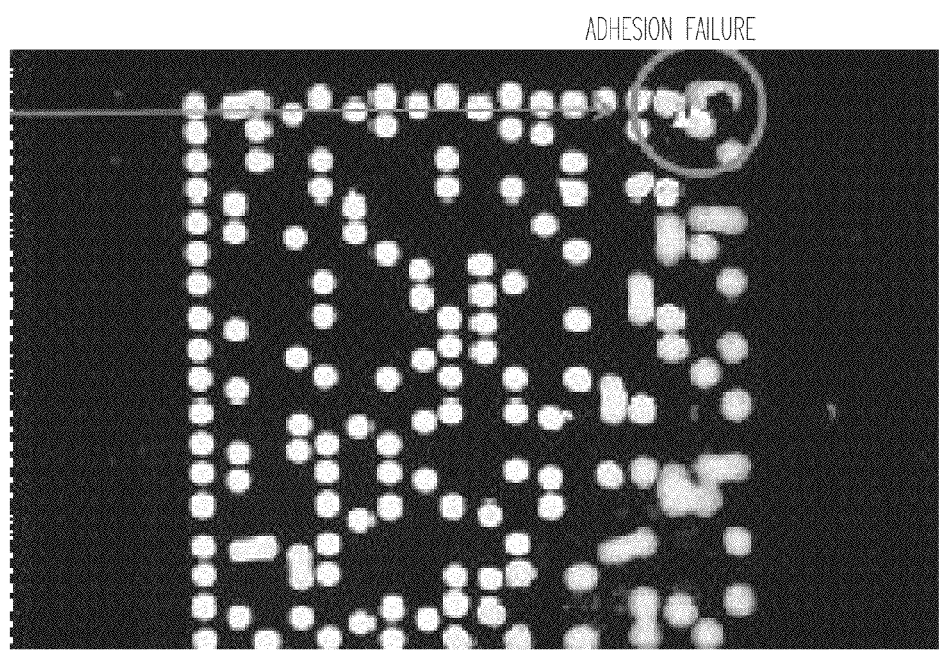
FIG. 1 is a microphotograph of a silicon die surface marked with a commercially available ink printed thereon, then subjected to testing conditions for determining general marking reliability.

As is shown in FIG. 1 commercially available inks which are presently used fail adhesively when printed onto a silicon die surface and then subjected to general marking reliability conditions. Such conditions for evaluating the durability of markings can include scratching and soaking in a glycol-based testing solution. It is desirable for markings on microelectronic packages, such as packages containing memory chips, CPU chips, and the like, to be indelible, i.e., to be sufficiently durable under normal use to persist for the operational life of the device in the microelectronic package.

Various types of UV-cured acrylate polymers, prepared by ultraviolet light induced polymerization of acrylate monomers in the presence of a photoinitiator, can be used to prepare markings on surfaces, but due to the lack of a suitable molecular anchor, have poor adherence to oxide surfaces, such as silicon or nickel oxides, and thus are prone to slough off in response to physical pressure.

This technical problem can be overcome using a method as disclosed herein. The present disclosure provides a method of anchoring a polymer to an oxide surface, comprising:

applying to a defined portion of the surface an acrylate monomer, a photoinitiator, and an adhesion promoter, wherein the monomer, the photoinitiator, and the adhesion promoter form a mixture;

wherein the adhesion promoter is of formula $Si(X)_n(R—Z)_{4-n}$, wherein each independently selected X is an oxide-reactive silicon-bonded group, each independently selected R is a spacer group, and each independently selected Z is an acrylate-reactive group, and n=1, 2, or 3; and, illuminating the mixture disposed on the surface with ultraviolet light to induce acrylate polymerization, under conditions suitable for reaction of oxide-reactive group X with the oxide surface, to provide an acrylate polymer incorporating the adhesion promoter, covalently anchored to the oxide surface.

The oxide surface can be the surface of a material containing silicon oxide, aluminum oxide, titanium oxide, copper oxide, or nickel oxide, or any other oxide useful for microelectronic packaging, integrated heat spreaders, or other microelectronic uses.

Figure 2A:
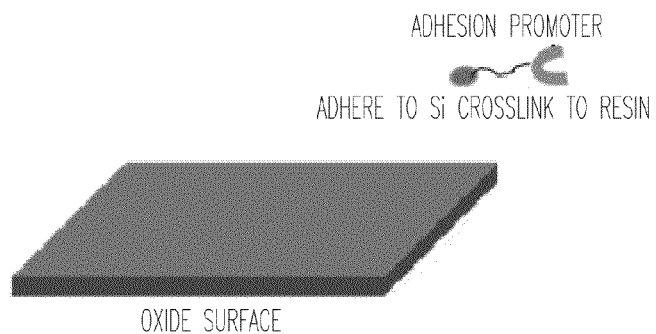
FIGS. 2A-2C shows processes in anchoring a polymer to an oxide surface according to the methods disclosed herein: 2A shows an oxide surface to be marked; 2B shows a UV-crosslinked ink droplet disposed on the oxide surface, 2C shows the crosslinked ink covalently anchored to the oxide surface.
Figure 2B:
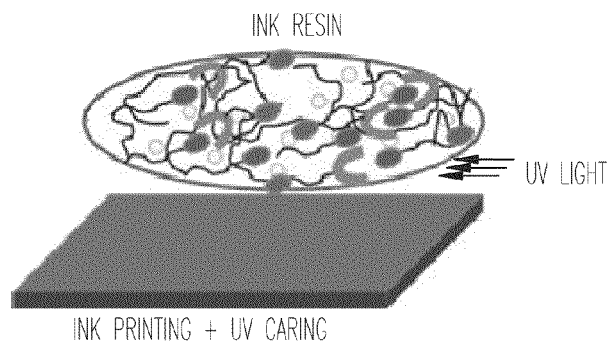
Figure 2C:
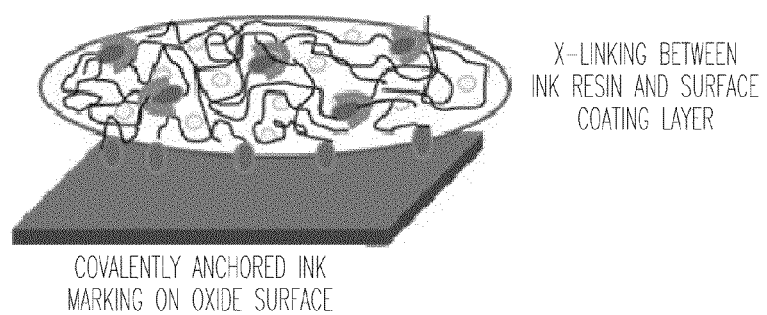

As shown schematically in FIGS. 2A-2C, addition of an adhesion promoter, wherein the adhesion promoter comprises an oxide-reactive silicon bonded group X connected via a linker R to an acrylate-reactive group Z, provides for covalent anchoring of the polyacrylate polymer formed by the UV curing process to the oxide groups exposed on the surface of the substrate.

The adhesion promoter of formula $Si(X)_n(R—Z)_{4-n}$, added to a dispensable mixture applied to the oxide surface (FIG. 2A) pre-curing, enables the polyacrylate polymer, photopolymerized in the presence of the photoinitiator (FIG. 2B), to bond directly and irreversibly to the oxide surface (FIG. 2C). The X groups bonded to the silicon can be any of the silyl groups known to react with oxide atoms, such as halo groups, e.g., chloride, or acyloxy groups, e.g., acetoxy, or alkoxy groups, e.g., methoxyl. Displacement of the X group by the oxide atom when the adhesion promoter is brought into contact with the surface does not require UV curing; this reaction can occur prior to the UV-induced polymerization of the acrylate, or concurrently with the UV-induced polymerization of the acrylate. This displacement reaction results in the formation of the strong, covalent silicon-oxygen bond, serving to bond the silicon-containing adhesion promoter to the oxide surface. Such reactions can readily occur at room temperature, requiring no special conditions to bring the coupling about.

The silicon atom, bonded to the oxide surface, is also bonded via a linker R to an acrylate-reactive group, then during UV-induced polymerization of the acrylate monomer in the presence of the photoinitiator becomes incorporated in the covalent linkages of the resulting polyacrylate. The presence of the linker group R facilitates this incorporation of the acrylate-reactive group Z in the UV-induced photopolymerization by maintaining a high degree of reactivity of the Z group in the polymerization without possible steric inhibition by the relatively bulky silyl group and the adjacent oxide surface to which it is bonded. Polymerization takes place under UV illumination, which can happen following application of the mixture comprising the acrylate monomer, the photoinitiator, and the adhesion promoter, to the oxide surface, or can happen concurrently with application to the surface. As shown in FIG. 2, the acrylate-reactive group Z becomes incorporated into the bulk polyacrylate polymer on UV curing, thus anchoring the polymer to the oxide surface.

The adhesion promoter has four groups bonded to the tetravalent silicon atom thereof; provided the silicon atom has at least one oxide-reactive group X, and at least one linker/acrylate reactive group R—Z, the relative proportions can vary. Accordingly there can be 1, 2, or 3 X groups, which can be identical with each other or which can be independently selected. Likewise, there can be 1, 2, or 3 R—Z groups bonded to the silicon atom of the adhesion promoter, which can be identical or different.

The linker group R can be a (C1-C26) alkylene chain, optionally branched, optionally comprising cycloalkyl, aryl, heterocyclyl, or heteroaryl rings, optionally comprising one or more heteroatoms selected from the set consisting of O, $NR^N$ wherein $R^N$ is H or (C1-C6) acyl, or $S(O)_q$, wherein q=0, 1, or 2. Thus, the linker can be a simple linear alkylene chain, such as any (C1-C26) alkylene group, including methylene (—$CH_2$—), ethylene (—$CH_2CH_2$—) groups, and the homologs out to longer chain lengths. Or, the linker group R can include rings, including all-carbon rings such as cycloalkyl or aryl rings within the linker chain, or including heteroatom-containing rings within the linker chain, such as heterocyclyl or heteroaryl rings. The linker can also contain heteroatoms such as oxygen, nitrogen, or sulfur. The sulfur can be present in sulfide, sulfoxide, or sulfone oxidation states. However, any heteroatom present in the linker should be compatible, i.e., unreactive, towards the Si—X bond of the oxide-reactive group, under the photopolymerization UV-curing conditions used. Simple experimentation by persons of ordinary skill can allow for selection of the linker group most suitable for the specific use intended.

The independently selected acrylate reactive group Z comprises a double bond that can enter into UV illumination photopolymerization reactions initiated by the photoinitiator. The photopolymerization of the acrylate monomer is carried out in the presence of the photoinitiator under UV light, as is well known in the art. The acrylate monomer can be any suitable monomer such as can be incorporated into a polymerization reaction; e.g., 3-(acryloyloxy)-2-hydroxypropyl methacrylate, di(trimethylolpropane) tetraacrylate, and trimethylolpropane propoxylate triacrylate. The photoinitiator can be any known photoinitiator suitable for such polymerization processes, including but not limited to compounds such as 3'-hydroxyacetophenone and phenylbis(2,4,6-trimethylbenzoyl)phosphineoxide. The polymerization of the acrylate groups can be initiated by free radicals that are generated upon irradiating photoinitiators with photons having sufficient energy. UV light having a wavelength of 365 nm can be used to initiate the curing of the acrylates, but other wavelengths may be used depending on the photoinitiator choice.

Examples of suitable adhesion promoters that can be included to achieve the solution to the technical problem of anchoring polyacrylates to oxide surfaces include compounds such as 3-(acryloxy)propyltrimethoxysilane, vinyltrimethoxysilane, vinyltrichlorosilane, or any mixture thereof.

The composition prepared by the method disclosed herein can be used in several different applications. For example, the mixture applied to the oxide surface can be suitable for an indelible ink for marking surfaces with information pertinent to the device contained in the microelectronic package or its intended use, identifying information, tracking information, parts numbers, serial numbers and the like. Silicon die and integrated heat spreaders are two examples of oxide surfaces present in microelectronic packages that could be marked with inks (FIG. 2A). FIG. 2B schematically shows the how the proposed ink marking becomes covalently anchored to oxide surfaces and results in robust markings on microelectronic package surfaces. A bare oxide surface such as the die or lid will have the ink mixture printed onto it. As the ink is printed from the dispense tool, it will be subjected to UV light to initiate crosslinking (see FIG. 2B-2C). One end of the adhesion promoters will crosslink into the polymer matrix of the ink while the other end will react with the oxide surfaces to form covalent bonds to robustly anchor the ink marking.

For an ink to provide a visible marking, it includes visualization agents, e.g., pigments, fillers and the like, such as can be viewed under illumination with visible light wavelengths; or can include fluorescent dyes and the like. An exemplary composition of an ink mixture based on the above-described methods and compositions is shown in Table 1.

TABLE 1

Conceptual composition of the ink marking formulation.

| Proposed Adhesive Ink for Marking Applications | Proposed weight % |
|---|---|
| Acrylate Resins | 50-80% |
| Photo-initiators | 1-5% |
| Fillers | 5-30% |
| Pigments | 1-5% |
| Adhesion Promoters | 1-10% |
| Other Additives | 1-5% |

Filler particles can be added to the ink marking formulation to tune the color and the mechanical properties of the ink. Examples of filler particle materials may include but are not limited to: titania, silica, aluminum, alumina, zirconia, and quartz. The color of the ink may also be altered through the addition of pigments in addition to the filler particles. Examples of pigments may include but are not limited to:

carbon black and organic dyes for non-black colors (blue, red, and green). The ability to tune the color of the ink allows one to ensure good contrast with the surface to be marked.

Figure 3A:
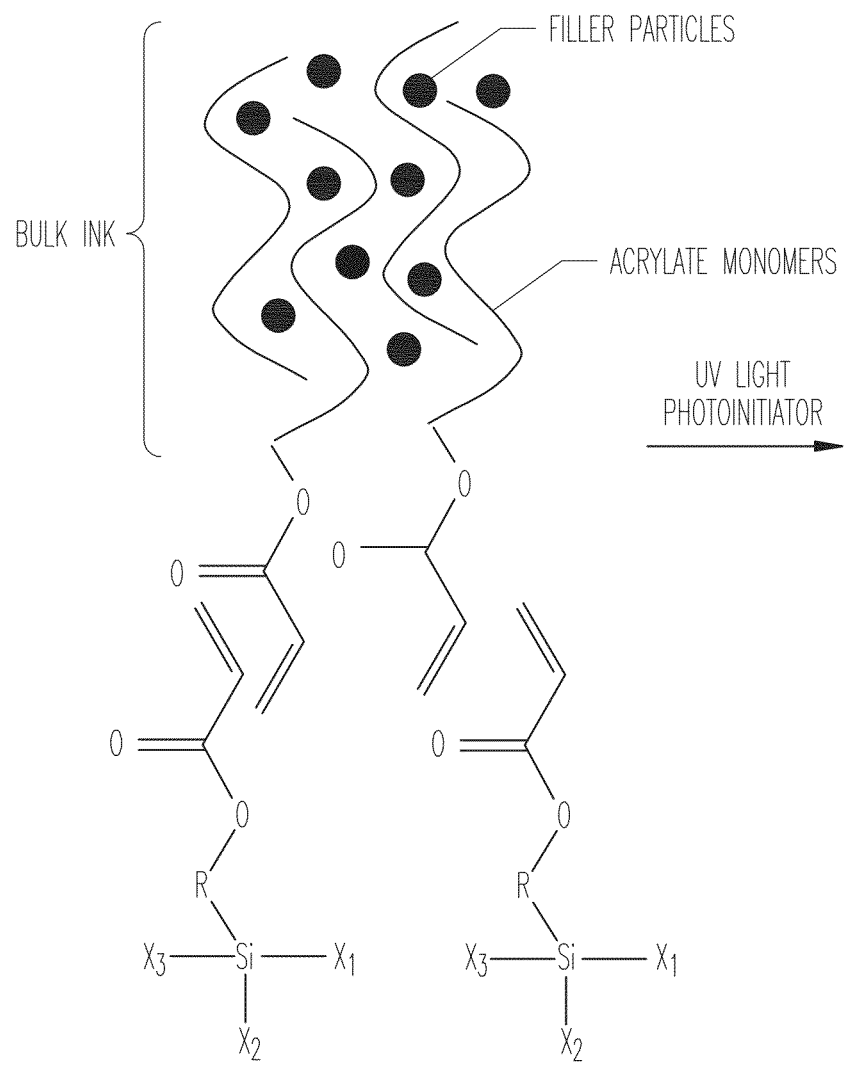
FIGS. 3A-3C shows the processes of anchoring a polyacrylate polymer via an adhesion promoter comprising an acryloxy-functionalized silicon reagent to an oxide surface: 3A shows an unreacted mixture of ink with acrylate ester groups, and an adhesion promoter; 3B shows the ink crosslinked with the adhesion promoter disposed on the oxide surface; 3C shows the ink covalently bonded to the oxide surface by the adhesion promoter.
Figure 3B:
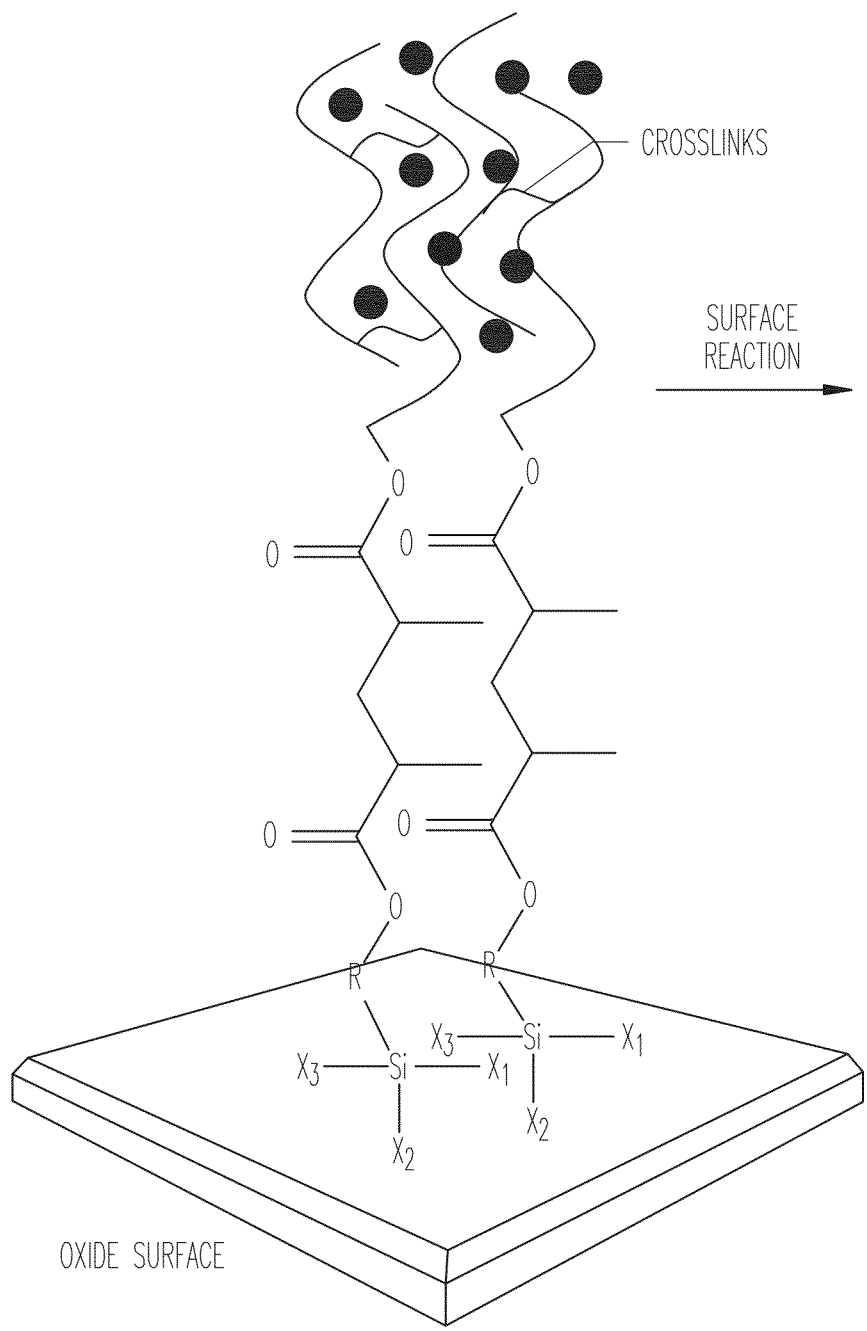
Figure 3C:
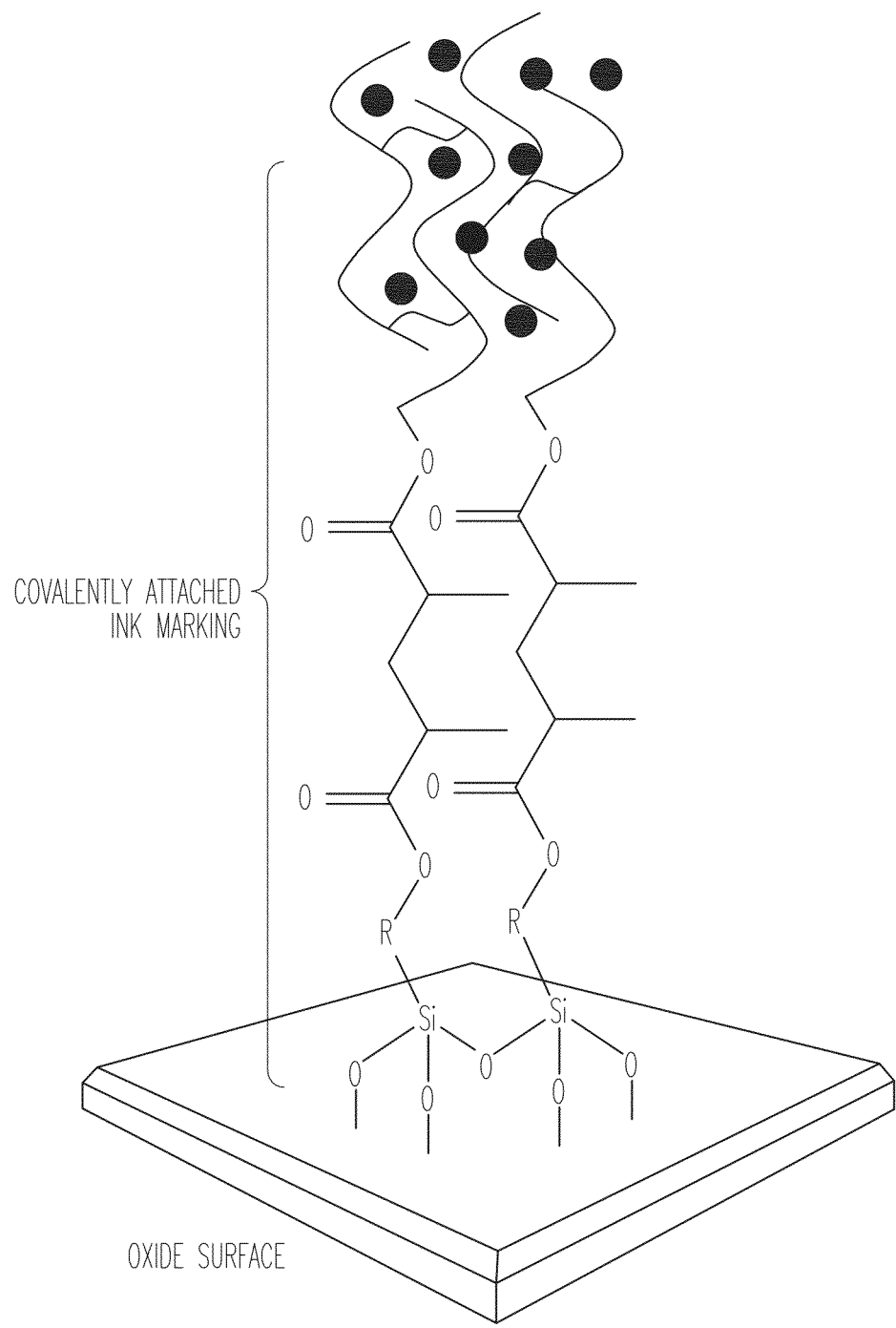
Figure 5A:
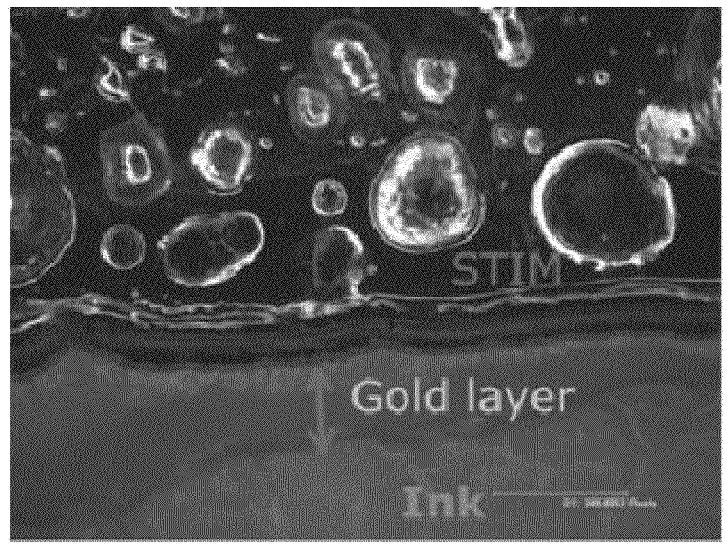
FIGS. 5A-5B shows an optical microscope image showing the non-wetting nature of ink barrier with indium solder-based thermal interface (S-TIM) materials.
Figure 5B:
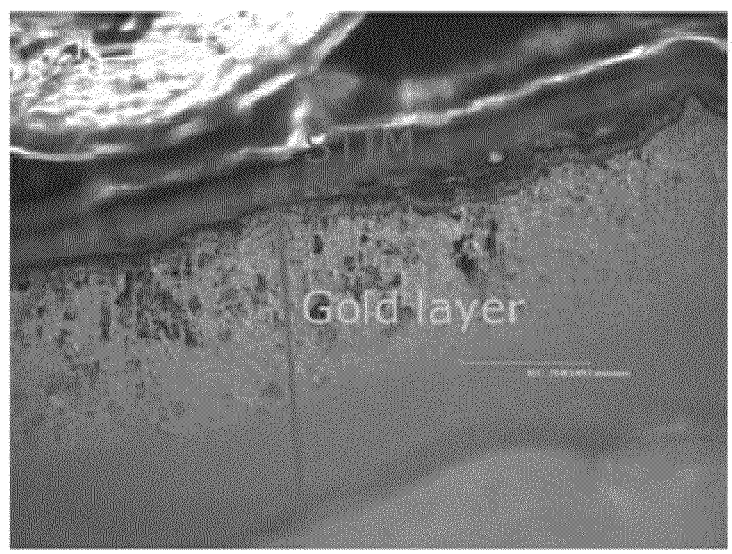

FIGS. 3A-3C show an embodiment of an indelible ink bonded to an oxide surface according to a method described herein, indicating a specific example of an adhesion promoter in anchoring a polyacrylate polymer to an oxide surface. FIGS. 3A-3C schematically show how adhesion promoters as disclosed and claimed herein can be added to improve the adhesion of current ink formulations for marking applications. The vinyl groups on the adhesion promoters (FIG. 3A) can crosslink with the vinyl groups of the acrylate resin upon irradiation of the ink formulation with UV light to generate free radicals from the photoinitiator molecules. This will result in a crosslinked ink (FIG. 3B) presenting surface-reactive groups such as silane groups that can subsequently form covalent bonds with the silicon die surfaces to be marked with the ink. The end result of the invention (FIG. 3C) is a covalently anchored ink marking. Schematic representation of the cross-linking and surface reactions of an ink marking formulation as disclosed herein: (FIG. 3A) Acrylate monomers and vinyl-containing adhesion promoters before exposing the ink to UV light. (FIG. 3B) Simultaneous dispensing of the ink onto an oxide surface in a microelectronic package and exposure to UV light to initiate the polymerization of the vinyl groups. (FIG. 3C) Surface reactions (hydrolysis and condensation) of the surface-specific groups on the adhesion promoters with the oxide surface to form a covalently anchored ink marking. $X_2$, $X_2$, $X_3$ can represent but are not limited to any combination of one to three hydrolyzable groups such as chloro or alkoxy groups. The R groups may include but are not limited to $C_1$-$C_{26}$ alkyl chains and chemical linkers containing unsaturated bonds and non-carbon atoms such as oxygen or nitrogen, as described above.

In other uses, the methods and compositions disclosed and claimed herein relate to microelectronic packaging uses other than for indelible marking; for example the methods herein can be used in the assembly and sealing of microelectronic packaging to prevent and avoid bleedout of solder-based thermal interface materials (S-TIM), which can be printed on an integrated heat spreader (IHS) or a silicon die edge, and which act as a chemical and physical barrier to prevent S-TIM bleed out at high reflow temperature. At reflow temperature (>156 C), Indium solder melts and starts bleeding out. The extent of solder bleed out is largely determined by state of package warpage at these high temperature and process parameters such as clip force, reflow temperature (Land Grid Array (LGA) vs Ball Grid Array BGA). This leads to significant increase in Rjc over die, especially die corners as well as increases risk for Die Side Capacitor DSC shorting. Due to low surface energy, the ink barrier material act as a chemical as well as physical barrier for molten Indium solder, preventing bleed out in lid cavity region and shorting of DSCs.

To demonstrate proof of concept, ink barrier material was printed and UV cured on several IHSs. STIM was then reflowed along with flux on these IHS and held together with clips, (see FIGS. 4A-4F and 5A-5B). As can be seen below after reflow ink barrier controls STIM bleed out.

The methods and compositions disclosed and claimed herein can also be used to prevent the bulk flow and bleed out of dispensable liquid sealant. As packages become smaller, keep-out zone (KOZ) specification limits are becoming tighter. Like many filled materials, liquid sealants are susceptible to bleed out during cure, where the silicone resin separates from the filler. Moreover, due to the traditionally slow rate of cure, there is greater tendency for sealant material to flow and effectively increase spread during cure. This makes it more difficult for dispensable materials to meet these requirements. Liquid sealants are also susceptible to non-uniform Bond Line Thickness BLT due to their liquid nature. Since they are shear thinning in nature, the lid can shift during placement, clip engagement or cure. This leads to greater variation in BLT. The BLT has an impact on the contact resistance between IHS and S-TIM, affecting thermals and also the stress on the die, affecting reliability performance.

To prevent bleed out or flow of organic sealants, such as epoxy or silicone resins, or of indium solder under reflow temperatures, a method as described herein can be used to indelibly print a barrier to such flow, wherein the surface properties of the polyacrylate that is covalently anchored to the oxide surface affect the surface tension of the liquid resin or indium solder such that the liquid is inhibited from flowing into the zones upon which the barrier is printed.

Figure 6A:
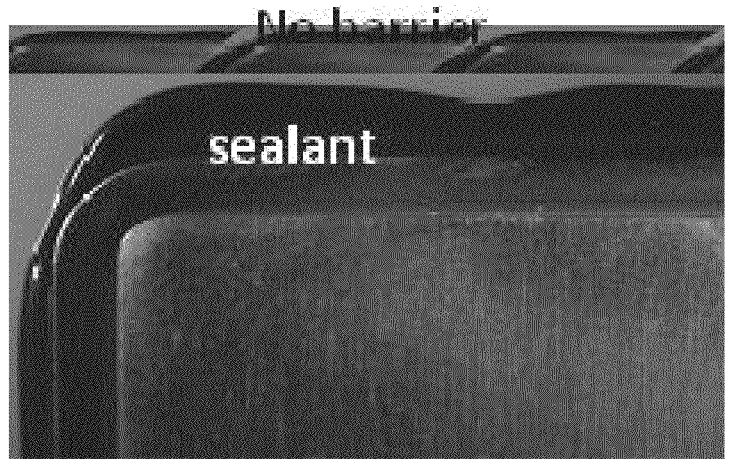
FIGS. 6A-6B shows sealant bleed out 6A without barrier, and 6B with polyacrylate barrier printed according to method disclosed herein.
Figure 6B:
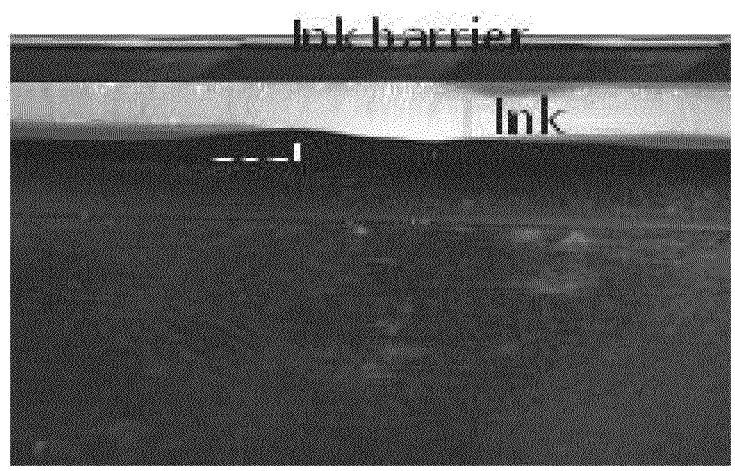

To demonstrate proof of concept, ink barrier material was printed and UV cured on several glass slides within sealant KOZ. Sealant was then dispensed and held together with clips. As can be seen below in FIGS. 6A-6B, a covalently anchored indelibly printer barrier controls sealant bleed out.

Compositions of matter disclosed and claimed herein can be used for the recited applications. Other uses will occur to persons of ordinary skill in the art. The disclosed subject matter thus includes a composition comprising an oxide surface with an acrylate polymer covalently anchored thereto, prepared by the method disclosed above. For example, the oxide surface can comprise silicon oxide, aluminum oxide, titanium oxide, copper oxide, or nickel oxide, which can be a constituent of a microelectronic package, integrated heat spreader, silicon die, and the like.

When the mixture that is applied to the oxide surface and covalently anchored thereto further comprises pigments, fillers, or both, the resulting anchored polymer can be used as an ink by selecting the defined portion of the surface to which the mixture is applied to convey marking information for the microelectronic package. In this manner letters, number, symbols, and the like can be permanently affixed to the surface for the conveyance of information to a reader.

Alternatively, when the mixture that is applied to the oxide surface and covalently anchored thereto is positioned to limit the flow of solder or sealants, the compositions function as barriers to repel a liquid solder (e.g., indium) or flowable organic sealant material (e.g., epoxy, silicon) subsequently applied to the surface to seal the microelectronic package.

Accordingly, the methods disclosed herein can be used to provide an ink for use in marking a surface of a microelectronic package, the surface comprising oxides, a sealant barrier for use in preventing flow of sealant into unwanted locations on the oxide surface during a package sealing process, or in applications wherein a permanently anchored organic polymer is to be bonded to an oxide surface of a microelectronic package or device.

In various embodiments, the disclosed subject matter provides a microelectronic device, comprising: a semiconductor chip attached to a chip package substrate; an oxide coating on the chip package substrate; and a marking on the oxide coating, the marking formed using an acrylate polymer incorporating an adhesion promoter, wherein the adhesion promoter is of formula $Si(X)_n(R-Z)_{4-n}$, wherein each independently selected X is an oxide-reactive silicon-bonded group, each independently selected R is a spacer group, and each independently selected Z is an acrylate reactive group, and n=1, 2, or 3.

In various embodiments, the disclosed subject matter provides a microelectronic device, comprising: a semiconductor chip attached to a chip package substrate; an oxide coating on the chip package substrate; a sealant located between a cover and the chip package substrate; and a flow inhibiting structure to prevent sealant flow during a package sealing step into unwanted locations on the oxide surface. For example, the flow inhibiting structure includes an acrylate polymer incorporating an adhesion promoter, wherein the adhesion promoter is of formula $Si(X)_n(R—Z)_{4-n}$, wherein each independently selected X is an oxide-reactive silicon-bonded group, each independently selected R is a spacer group, and each independently selected Z is an acrylate reactive group, and n=1, 2, or 3. For example, the sealant can include a silicone or an epoxy.

The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. A method of anchoring a polymer to an oxide surface, comprising:
    applying to a defined portion of the surface an acrylate monomer, a photoinitiator, and an adhesion promoter, wherein the monomer, the photoinitiator, and the adhesion promoter form a mixture;
    wherein the adhesion promoter is of formula $Si(X)_n(R—Z)_{4-n}$, wherein each independently selected X is an oxide-reactive silicon-bonded group, each independently selected R is a spacer group, and each independently selected Z is an acrylate reactive group, and n=1, 2, or 3; and,
    illuminating the mixture disposed on the surface with ultraviolet light to induce acrylate polymerization, under conditions suitable for reaction of oxide-reactive group X with the oxide surface, to provide an acrylate polymer incorporating the adhesion promoter, covalently anchored to the oxide surface.

2. The method of claim 1, wherein each independently selected oxide-reactive group X is halo, alkoxy, or acyloxy.

3. The method of claim 1, wherein each independently selected linker R is a (C1-C26) alkyl chain, optionally branched, optionally comprising cycloalkyl, aryl, heterocyclyl, or heteroaryl rings, optionally comprising one or more heteroatoms selected from the set consisting of O, $NR^N$ wherein $R^N$ is H or (C1-C6)alkyl, or $S(O)_q$, wherein q=0, 1, or 2.

4. The method of claim 1, wherein each independently selected acrylate reactive group Z comprises a double bond.

5. The method of claim 1, wherein the adhesion promoter is 3-(acryloxy)propyltrimethoxysilane, vinyltrimethoxysilane, vinyltrichlorosilane, or any mixture thereof.

6. The method of claim 1, wherein the oxide surface comprises silicon oxide, aluminum oxide, titanium oxide, copper oxide, or nickel oxide.

7. The method of claim 1, wherein the oxide surface is disposed on a microelectronic package.

8. The method of claim 7, wherein the mixture applied to the oxide surface and covalently anchored thereto further comprises pigments, fillers, or both, and the defined portion of the surface to which the mixture is applied is selected to convey information related to the microelectronic package.

9. The method of claim 7, wherein the mixture applied to the oxide surface and covalently anchored thereto functions as a sealant barrier to repel a dispensable sealant material subsequently applied to the surface to seal the microelectronic package.

10. The method of claim 9, wherein the dispensable sealant material comprises a silicone or an epoxy.

11. A composition comprising an oxide surface with an acrylate polymer covalently anchored thereto, prepared by the method of claim 1.

12. The composition of claim 11 wherein the oxide surface comprises silicon oxide, aluminum oxide, titanium oxide, copper oxide, or nickel oxide.

13. The composition of claim 12, wherein the oxide surface is disposed on a microelectronic package.

14. The composition of claim 13, wherein the mixture applied to the oxide surface and covalently anchored thereto further comprises pigments, fillers, or both, and the defined portion of the surface to which the mixture is applied is selected to convey marking information for the microelectronic package.

15. The composition of claim 13, wherein the mixture applied to the oxide surface and covalently anchored thereto functions as a sealant barrier to repel a dispensable sealant material subsequently applied to the surface to seal the microelectronic package.

16. A microelectronic package comprising the composition of claim 13.

17. A microelectronic package comprising the composition of claim 14, wherein the composition is disposed on the surface to provide information related to the microelectronic package.

18. A microelectronic package comprising the composition of claim 15, wherein the composition is disposed to prevent sealant flow during a package sealing process into unwanted locations on the oxide surface.

19. An ink for use in marking a surface of a microelectronic package, the surface comprising oxides, comprising the mixture as defined in the method of claim 1.

* * * * *

UNITED STATES PATENT AND TRADEMARK OFFICE
CERTIFICATE OF CORRECTION

| | | |
|---|---|---|
| PATENT NO. | : 8,900,919 B2 | |
| APPLICATION NO. | : 13/801059 | |
| DATED | : December 2, 2014 | |
| INVENTOR(S) | : Lowe, Jr. et al. | |

It is certified that error appears in the above-identified patent and that said Letters Patent is hereby corrected as shown below:

In the Claims

In column 7, line 48, in Claim 3, delete "(C1-C26)" and insert --$(C_1-C_{26})$--, therefor In column 7, line 52, in Claim 3, delete "(C1-C6)" and insert --$(C_1-C_6)$--, therefor Signed and Sealed this
Seventeenth Day of November, 2015

Michelle K. Lee
*Director of the United States Patent and Trademark Office*